(12) United States Patent
Keating (10) Patent No.: US 7,474,712 B1
(45) Date of Patent: Jan. 6, 2009

(54) DIGITAL UNDERSAMPLING

(75) Inventor: Pierce Keating, Issaquah, WA (US)

(73) Assignee: RadioFrame Networks, Inc., Redmond, WA (US)

( * ) Notice: Subject to any disclaimer, the term of this patent is extended or adjusted under 35 U.S.C. 154(b) by 716 days.

(21) Appl. No.: 10/749,799

(22) Filed: Dec. 30, 2003

Related U.S. Application Data (60) Provisional application No. 60/437,665, filed on Dec. 31, 2002.

(51) Int. Cl.
*H04L 24/00* (2006.01)
(52) U.S. Cl. ...................................... 375/324
(58) Field of Classification Search ............... 375/322, 375/324, 315; 329/315
See application file for complete search history.

(56) References Cited

U.S. PATENT DOCUMENTS 5,467,294 A * 11/1995 Hu et al. .................... 708/276
6,141,389 A * 10/2000 McCallister et al. ........ 375/295
6,682,483 B1 * 1/2004 Abend et al. ................ 600/437
2002/0118704 A1 * 8/2002 Enam et al. ................. 370/503
2004/0101067 A1 * 5/2004 Abe et al. ................... 375/322

OTHER PUBLICATIONS

Lyons, Richard G., "Understanding Digital Signal Processing", "Digital Signal Processing Tricks", Prentice Hall PTR Publication, Apr. 2001, pp. 385-400.

\* cited by examiner

*Primary Examiner*—Kevin M Burd
(74) *Attorney, Agent, or Firm*—Van Pelt, Yi & James LLP (57) ABSTRACT

A method and system for processing a signal are disclosed. The method comprises: applying an algorithm to selectively negate a plurality of samples of the signal to provide negated and non-negated samples of the signal, and use the negated and non-negated samples as in-phase (I) and/or quadrature (Q) components of a plurality of complex samples, the algorithm being such that the plurality of complex samples are equivalent to the result that would be obtained by applying an effective sampling function to the signal, and selecting a beat frequency of the effective sampling function by adjusting the algorithm.

15 Claims, 11 Drawing Sheets

DIGITAL UNDERSAMPLING

CROSS REFERENCE TO RELATED APPLICATIONS

This application claims priority to U.S. Provisional Patent Application No. 60/437,665 entitled METHOD OF COMPLEX DIGITAL UNDERSAMPLING filed Dec. 31, 2002, which is incorporated herein by reference for all purposes.

FIELD OF THE INVENTION

The present invention relates generally to signal processing. More specifically, an undersampling technique is disclosed.

BACKGROUND OF THE INVENTION

Signal downconversion is an important aspect of many electronic systems. For example, in many communications systems, signals modulated on relatively high frequency carrier signals are downconverted to lower frequency baseband and then further processed.

Downconversion is sometimes implemented by mixing the modulated signal with another signal generated by a local oscillator (LO). The frequency of the local oscillator signal is typically set to be the same as the carrier frequency of the modulated complex signal. The resulting signal is then low pass filtered and sampled to generate a baseband signal centered at approximately 0 Hz or DC. However, such an implementation is sometimes impractical because the circuit generally requires a dedicated analog mixer that is often implemented as a discrete component. The inclusion of the analog mixer may increase the complexity and production cost of the receivers.

Figure 1:
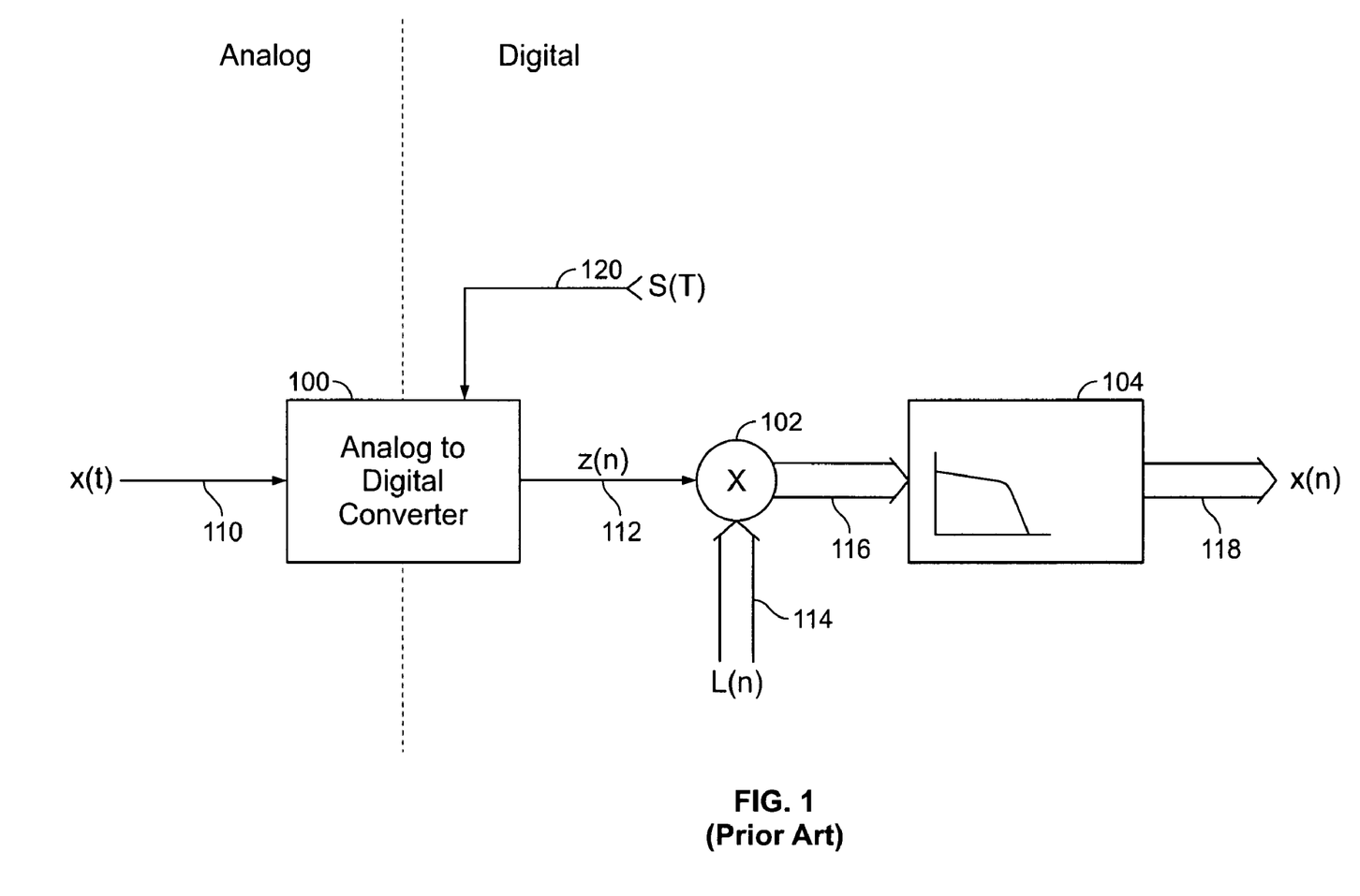
FIG. 1 is a block diagram illustrating a digital receiver circuit that eliminates the analog mixer.

FIG. 1 is a block diagram illustrating a digital receiver circuit that eliminates the analog mixer. In this example, a modulated complex input signal 110 (denoted as x(t)) is undersampled by an analog-to-digital converter (ADC). Signal 120 (denoted as s(T)) is the sampling signal used by the ADC. Digital mixer 102 performs a quadrature demodulation on undersampled output 112 (denoted as z(n)) by multiplying z(n) with a complex local oscillator signal 114 (denoted as L(n)). Mixer output 116 is then low pass filtered by filter 104 to obtain a baseband signal 118 (denoted as x(n)).

Figure 2A:
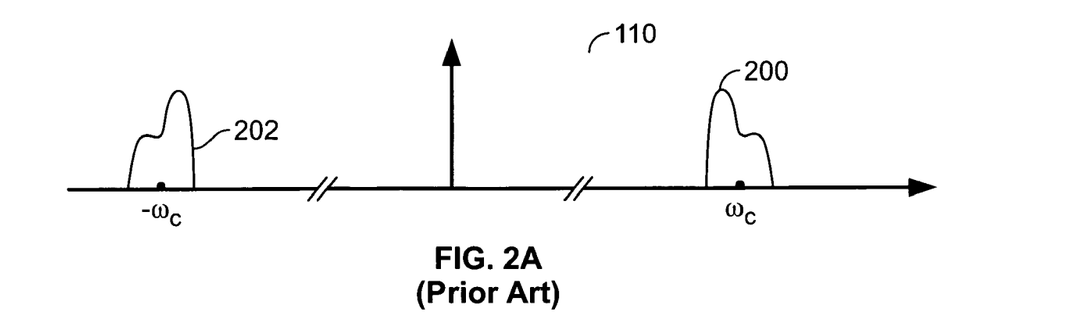
FIG. 2A is a plot illustrating the frequency spectrum of a complex modulated signal (x(t) shown in FIG. 1).
Figure 2B:
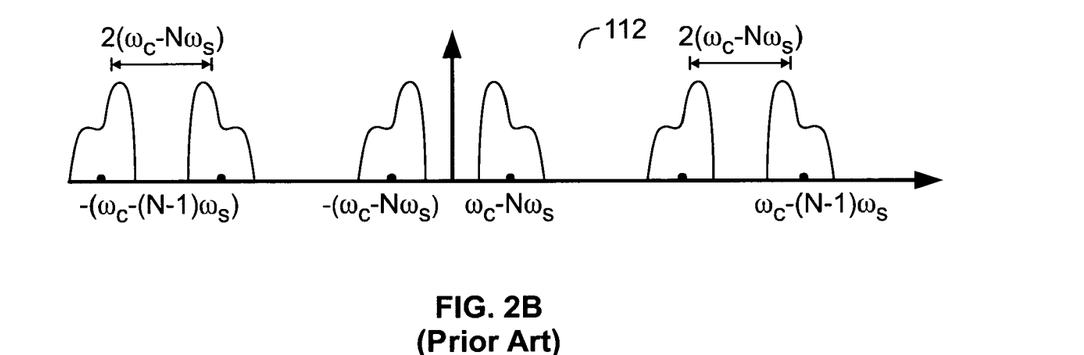
FIG. 2B is a plot illustrating the frequency spectrum of an undersampled modulated signal (z(n) shown in FIG. 1).
Figure 2C:
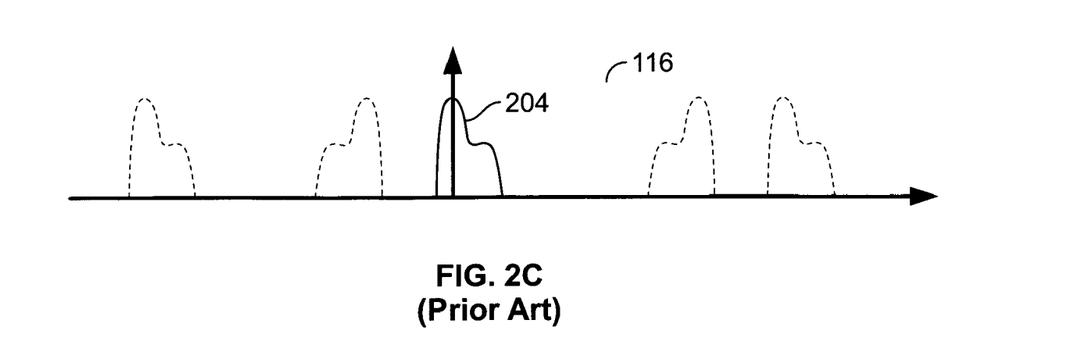
FIG. 2C is a diagram illustrating the frequency spectrum of a demodulated signal (signal 116 shown in FIG. 1).

FIG. 2A is a plot illustrating the frequency spectrum of a complex modulated signal (x(t) shown in FIG. 1). The carrier frequency of the signal in this example is $\omega_c$. The signal is shown to have a positive image 200 and a negative image 202. FIG. 2B is a plot illustrating the frequency spectrum of an undersampled modulated signal (z(n) shown in FIG. 1). The fundamental frequency of the sampling signal used in this example, s(T), is lower than the carrier frequency of x(t). Because the sampling signal includes harmonic frequencies, the undersampled output 112 includes replicas of the modulated signal occurring at regular intervals. FIG. 2C is a diagram illustrating the frequency spectrum of a demodulated signal (signal 116 shown in FIG. 1). After the mixing, the modulated signal replicas are shifted and one of the positive image replicas is translated to baseband. The signal is then low pass filtered to obtain a baseband signal 204.

While undersampling a complex modulated signal can eliminate the analog quadrature mixing stage, the circuit still requires a digital quadrature mixer after the signal is sampled. It would be useful to be able to convert a complex modulated signal to a baseband signal without requiring a digital mixer. It would also be useful if the conversion would not introduce much distortion due to aliasing between positive and negative images of the complex modulated signal.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A signal processing technique is disclosed. In some embodiments, an algorithm is applied to selectively negate a plurality of samples of the signal to provide negated and non-negated samples of the signal, and use the negated and non-negated samples as in-phase (I) and/or quadrature (Q) components of a plurality of complex samples. The algorithm is such that the plurality of complex samples is equivalent to the result that would be obtained by applying an effective sampling function to the signal. A beat frequency of the effective sampling function is selected by adjusting the algorithm. In some embodiments, selected samples of a signal are negated, the samples are sorted, and complex samples are generated using the selectively negated and sorted samples. The effective sampling function may be changed by adjusting the negation and/or the sorting. In some embodiments, the effective sampling function is changed to obtain a desired effective sampling function frequency spectrum. The effective sampling function may be changed such that its frequency spectrum includes a frequency that is within a desired range.

Figure 3A:
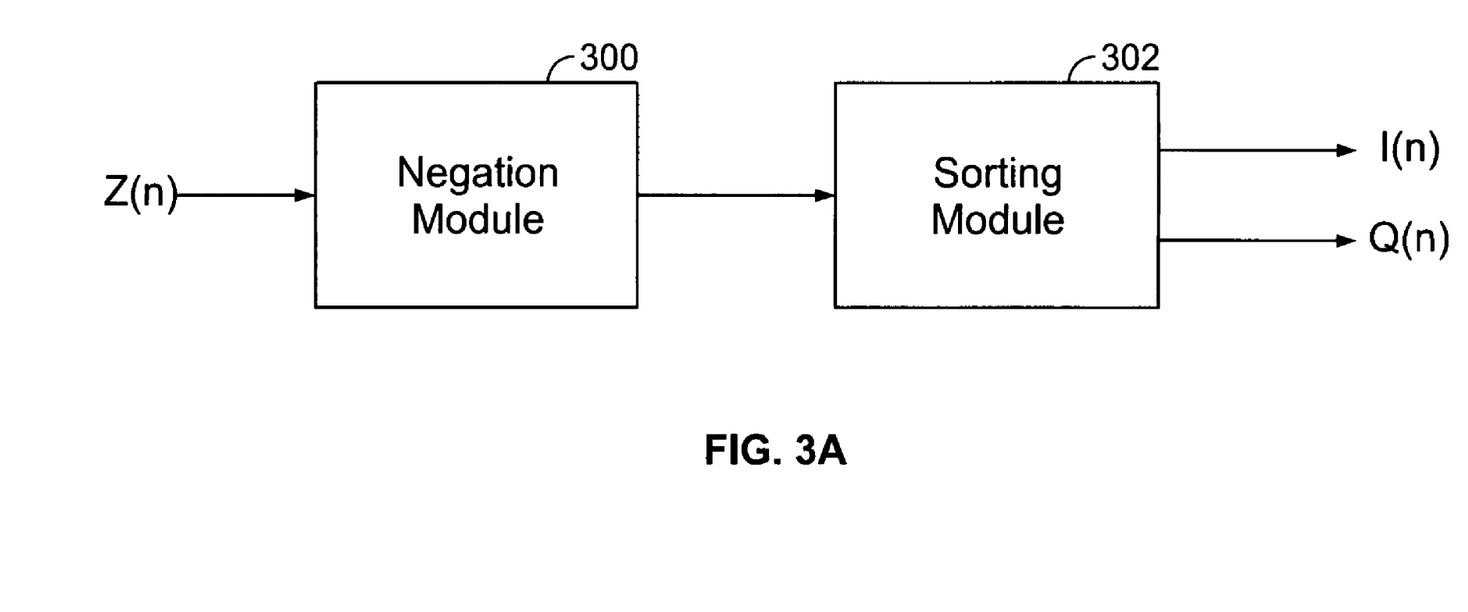
FIG. 3A is a block diagram illustrating a signal processing system according to one embodiment.

FIG. 3A is a block diagram illustrating a system according to one embodiment. In this example, digital samples of a signal, z(n), are sent to a negation module 300 that negates selected samples. The samples processed by the negation module 300 are then sent to a sorting module 302, which sorts the samples into signal components. In some embodiments, the negation module is configured to selectively negate certain samples according to a negation sequence. In some embodiments, the sorting module is configured to determine the arrangement of I component samples and Q component samples according a sorting sequence. In some embodiments, the same sample may be sorted into both I and Q components. Other algorithms may also be used to provide selectively negated I and Q samples.

The negation module and the sorting module may be implemented using a field programmable gate array (FPGA), other integrated circuits (ICs), as processes running on one or more processors, or any other appropriate hardware/software combination. In some embodiments, the functions of the two modules are combined into a single component. Although the example above shows that sorting takes place after negation, the operations may be reversed, interspersed, or arranged in any other appropriate order.

Figure 3B:
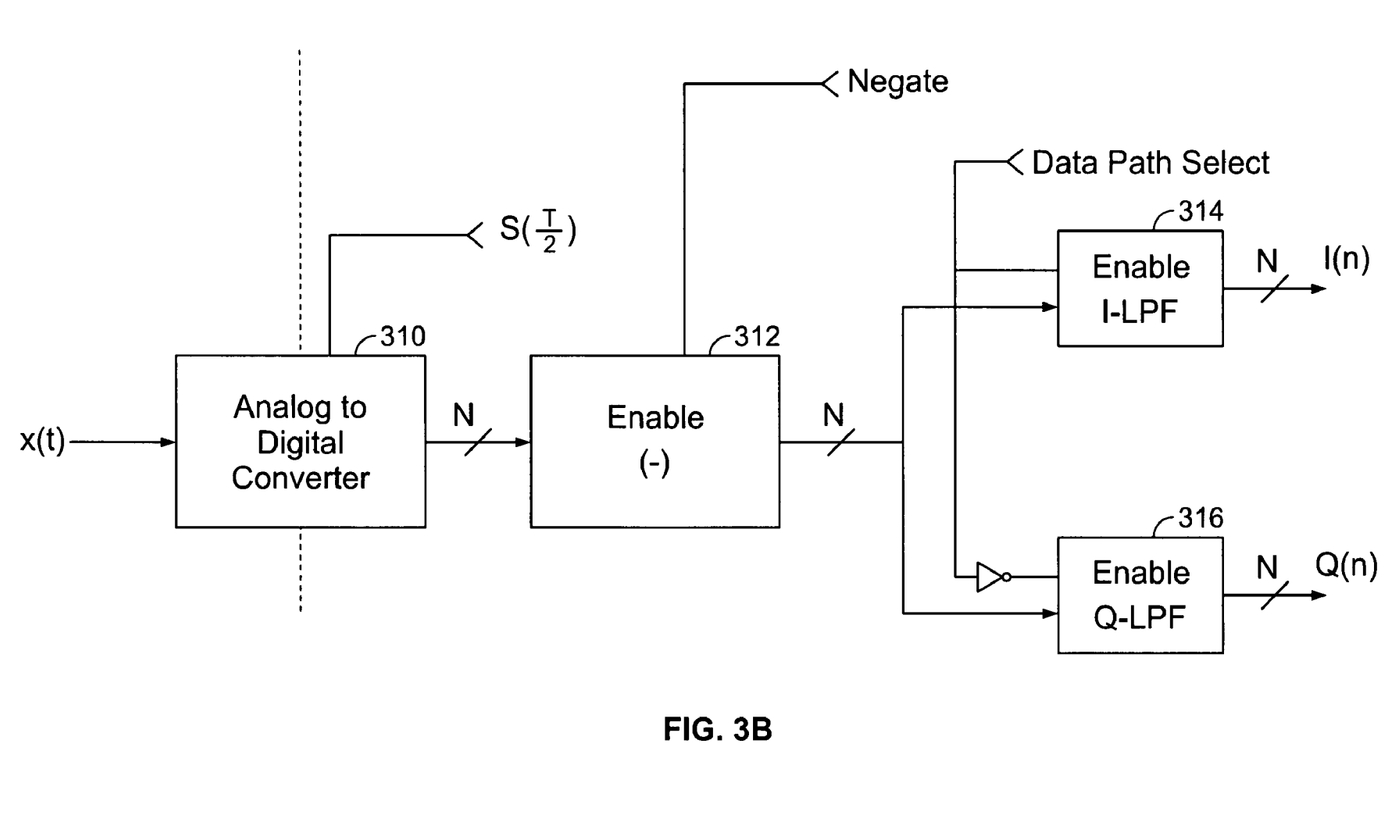
FIG. 3B is a block diagram illustrating another signal processing system embodiment.

FIG. 3B is a block diagram illustrating another system embodiment. In this example, an analog input x(t) is sampled by an ADC 310. As used herein, the sampling of the analog signal refers to the conversion of the analog signal values at the appropriate sampling instances to their corresponding quantized values each of which includes one or more information bits. The sampling process is also sometimes referred to as a digitization process. In this example, the signal is undersampled, which means that the ADC is sampling the signal at a rate that is less than what is required by the Nyquist criteria. The negation module in this example includes an inverter 312 that is selectively enabled to invert the digital samples according to a periodic negation sequence. The sorting module includes a low pass filter 314 and a low pass filter 316, configured to filter the I and Q components of the downconverted signal, respectively. A data path select signal periodically enables or disables the paths to the filters according to a sorting sequence, in order to obtain the desired complex baseband signal. As used herein, a baseband signal refers to a signal that is not modulated by a carrier frequency. Examples of baseband signals include signals that are modulated into symbols according to modulation schemes such as spread spectrum modulation, Gaussian Minimum Shift Keying (GMSK), phase shift keying (PSK), etc. For the purposes of illustration, the conversion of a signal to a lower frequency is discussed extensively in this specification. The technique is also applicable to converting a signal to a higher frequency.

Figure 4:
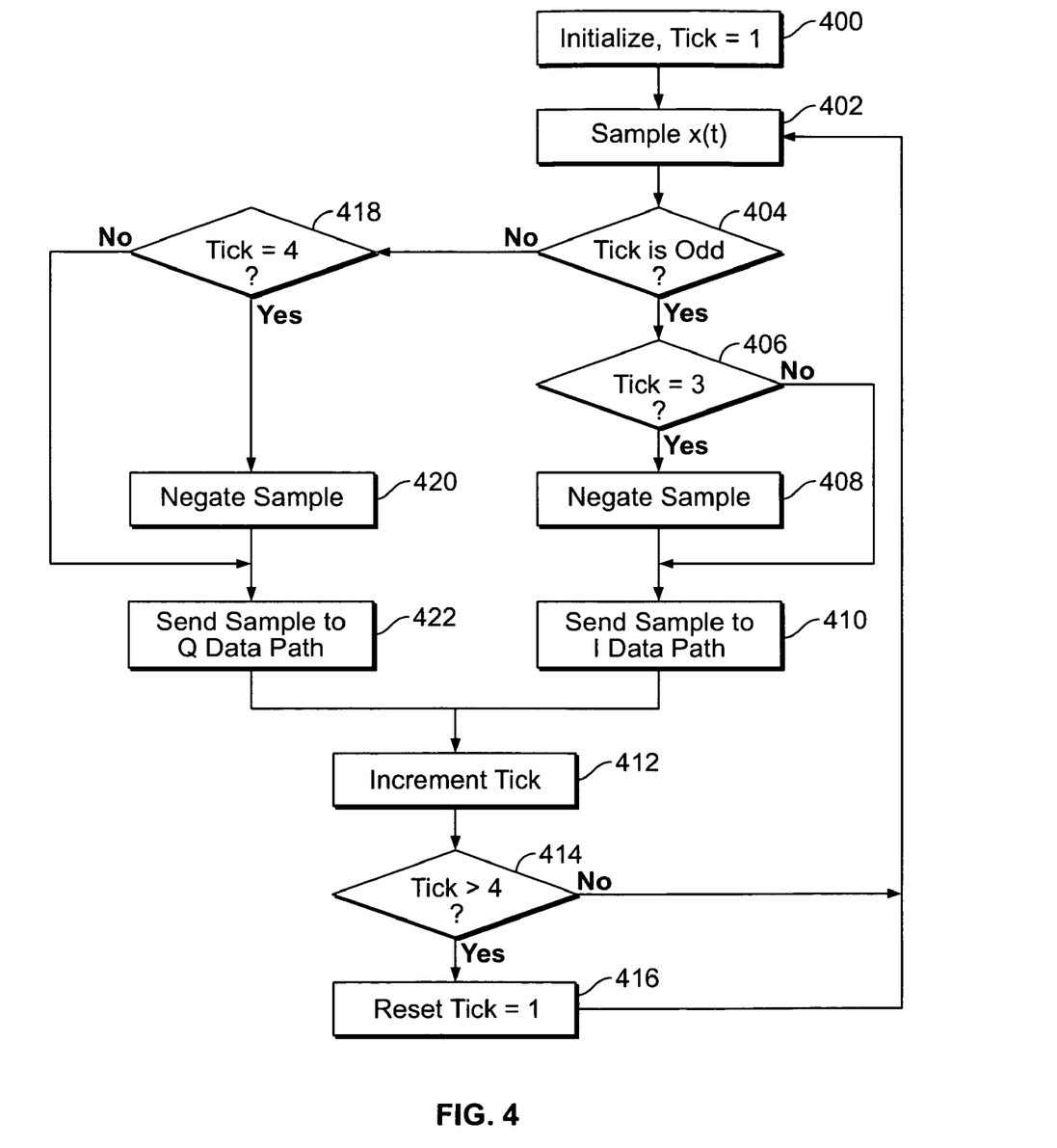
FIG. 4 is a flowchart illustrating a process that downconverts a modulated complex signal to complex baseband digital samples, according to one embodiment.

FIG. 4 is a flowchart illustrating a process that downconverts a modulated complex signal to complex baseband digital samples, according to one embodiment. In this example, a function s(t) continuously generates periodic complex sampling events. Each sample is handled in one of four ways. A variable, "tick", is defined and used to track which of the four ways will be used to handle a particular sample, such that each of the four ways of handling samples is applied once every four samples, in the same order. Tick is set to 1 when the process initializes (400). A sample of x(t) is taken when the sampling event occurs (402). It is then determined whether tick is odd (404). If tick is odd, it is then determined whether tick is equal to 3 (406). The sample is negated when tick is equal to 3 (408) and is not negated when tick is equal to 1. The sample is then sent to the in-phase data path (410). Tick is then incremented (412).

If, however, tick is even (404), it is then determined whether tick is equal to 4 (418). The sample is negated when tick is equal to 4 (420) and is not negated when tick is equal to 2. The sample is then sent to the quadrature data path (422). Tick is then incremented (412).

Once tick is incremented (412), it is determined whether tick is greater than 4 (414). If tick is greater than 4, tick is reset to 1 (416). Otherwise, the value of tick remains unchanged. The process repeats and a new sample is taken (402).

By applying a process such as the one shown in FIG. 4, a complex modulated signal such as x(t) of FIG. 3B is directly downconverted to obtain complex baseband samples of the signal. As used herein, direct downconversion refers to the translation of a signal to a lower frequency without using either an analog or digital mixer. The complex baseband sample components I(n) and Q(n) generated by the process are equivalent to the results that would be obtained by applying a certain complex sampling function to x(t). The complex sampling function corresponding to the downconversion process is referred to as an effective sampling function.

Figure 5A:
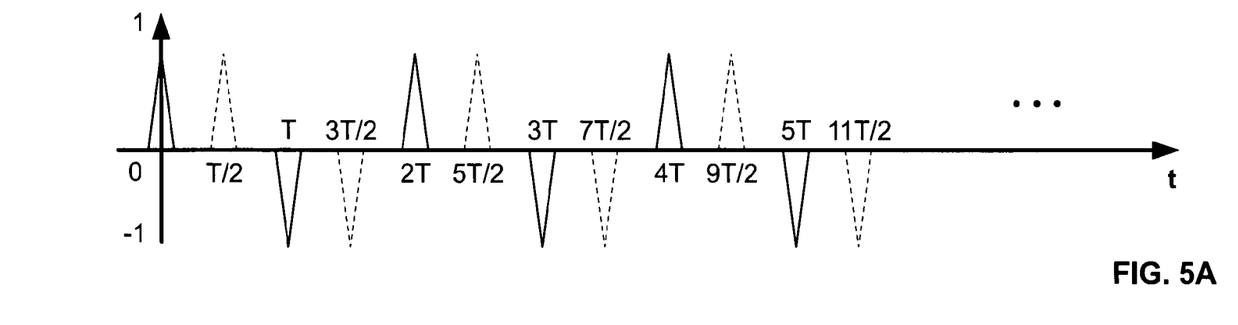
FIGS. 5A-5C are plots illustrating an example in which a positive image of a modulated complex signal is downconverted to baseband.
Figure 5B:
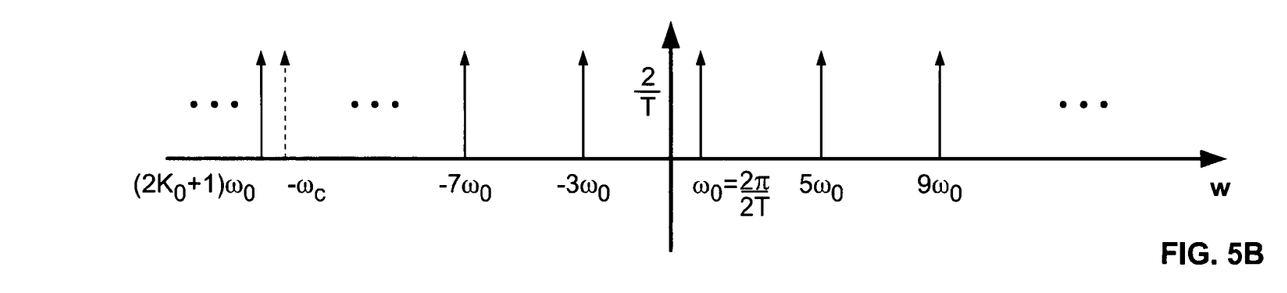

Different downconversion processes may result in different effective sampling functions. FIGS. 5A-5B are plots illustrating the effective sampling function that corresponds to the downconversion process shown in FIG. 4. FIG. 5A is a time domain plot illustrating the effective sampling function. In this example, the sampling events are shown as pulses in the signal. The pulses that provide the in-phase samples are illustrated using solid lines and the pulses that provide the quadrature samples are illustrated using dashed lines. The selection sequence has a periodic pattern of an in-phase sample followed by a quadrature sample. The negation sequence has a periodic pattern of two non-negated samples followed by two negated samples.

FIG. 5B is a plot illustrating the frequency spectrum of the effective sampling function shown in FIG. 5A. In this example, the effective sampling function is represented by the following Fourier series:

$$f(t)=(2/T)(e^{j\omega_0 t}+e^{-j3\omega_0 t}+e^{j5\omega_0 t}+e^{-j7\omega_0 t}+e^{j9\omega_0 t}+e^{-j11\omega_0 t}+e^{j13\omega_0 t}+\ldots).$$

where T is the complex sampling rate for I and Q channels respectively, $\omega_0$ is the fundamental frequency (also referred to as the beat frequency) of the effective sampling function. The overall sampling rate of the ADC is twice the complex sampling rate in this example. Stated another way, in the example shown in FIG. 4 two output samples of the ADC are required to generate a single complex sample at baseband (one sample to generate the I component and a second to generate the Q component). In the example shown, $\omega_0$ equals $2\pi/nT$, where nT is the period of the beat frequency. n, also referred to as the beat coefficient, is equal to the number of complex samples obtained during a complex sampling period. In the example shown, the complex sampling period lasts 2T, and 2 complex samples are obtained during this period, thus n is equal to 2. To avoid distortion due to aliasing in the baseband signal, the beat frequency is preferably chosen to be greater than half the bandwidth of the baseband signal. The sampling function also includes a plurality of analytic signals with harmonic frequencies of $(2k+1)\omega_0$, where k is an integer. In this example, the sampling sequence is chosen in such a manner that one of the analytic signals (signal 500) has a negative frequency of $(2k_0+1)\omega_0$ that is equal to the carrier frequency $-\omega_c$.

Figure 5C:
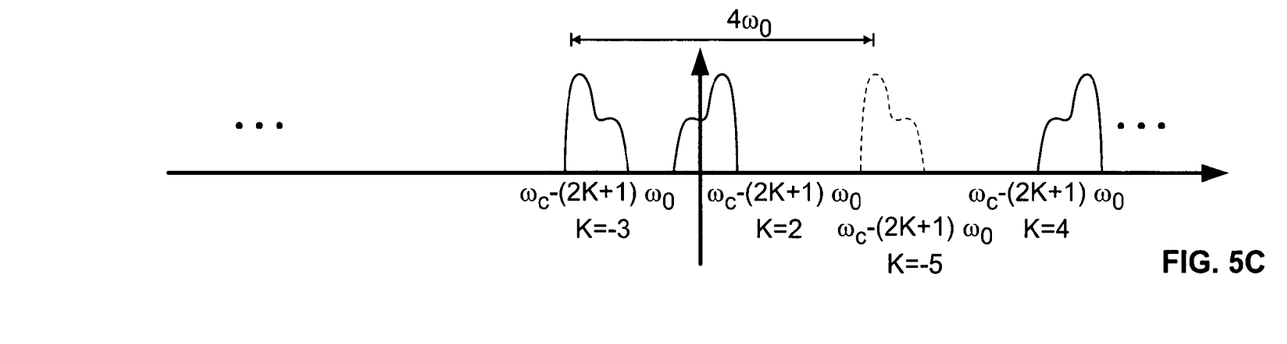

FIG. 5C is a plot illustrating the frequency spectrum of a downconverted complex signal according to one embodiment. In this example, the complex modulated signal to be downconverted is the same as the signal shown in FIG. 2A. The signal is directly downconverted by the effective sampling function shown in FIGS. 5A-5B. Since the harmonic frequency $(2k_0+1)\omega_0$ is equal to the carrier frequency $-\omega_c$, sampling x(t) with this harmonic frequency has the effect of shifting the negative image of the signal to baseband.

The effective sampling function may be changed by adjusting the selection for negation, the ordering of I and Q samples, or both to obtain a desired effective sampling frequency spectrum. In some embodiments, the changes are made to obtain a desired effective sampling function having a harmonic frequency that is within a desired range. For example, while a negative image of the modulated complex signal is selected in the example shown in FIGS. 5A-5C, a positive image may alternatively be chosen by adjusting the sampling sequence and arriving at another effective sampling function.

Figure 6A:
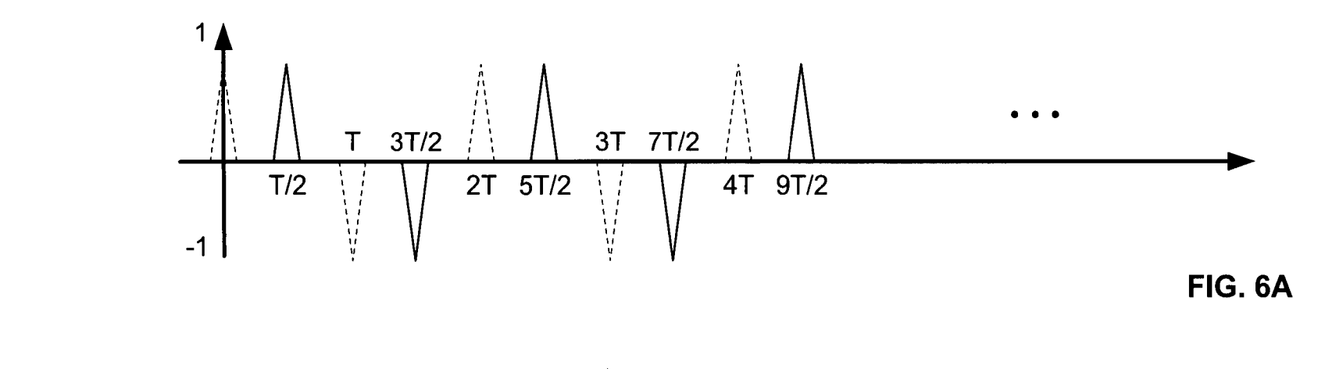
FIGS. 6A-6C are plots illustrating an example in which a negative image of a modulated complex signal is downconverted to baseband.
Figure 6B:
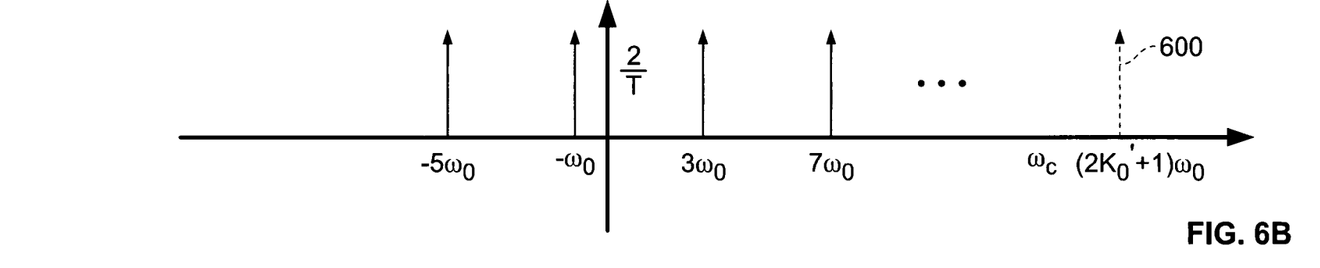
Figure 6C:
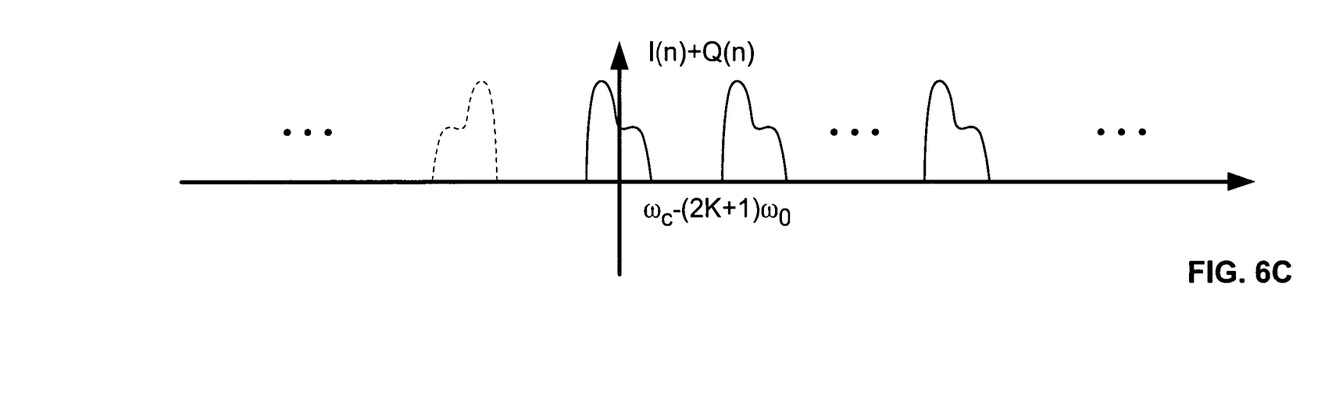

FIGS. 6A-6C are plots illustrating an example in which a negative image of a modulated complex signal is downconverted to baseband. FIG. 6A a time domain plot illustrating an effective sampling function according to one embodiment. The effective sampling function shown in this example is similar to the one shown in FIG. 5A, except that the quadrature sampling event leads the in-phase sampling event. FIG. 6B is a frequency domain plot illustrating the frequency spectrum of the effective sampling function shown in FIG. 6A. In this example, the effective sampling function has a positive frequency harmonic $(2k_0'+1)\omega_0$ that is equal to $\omega_c$ (shown as signal 600). The function shown in FIG. 6B is orthogonal with respect to the function shown in FIG. 5B since the energy for each of the functions is present at unique frequencies.

FIG. 6C is a plot illustrating the frequency spectrum of another example of a downconverted complex signal. In this example, a complex modulated signal similar to signal shown in FIG. 2A is undersampled and directly downconverted by the effective sampling function shown in FIGS. 6A-6B. A positive image of a signal replica generated by the harmonic frequency $(2k_0'+1)\omega_0$ is directly downconverted to baseband in this case. Thus, by adjusting the sampling signal and changing the order of the in-phase and quadrature sampling events, image selection functionality can be provided.

Figure 7:
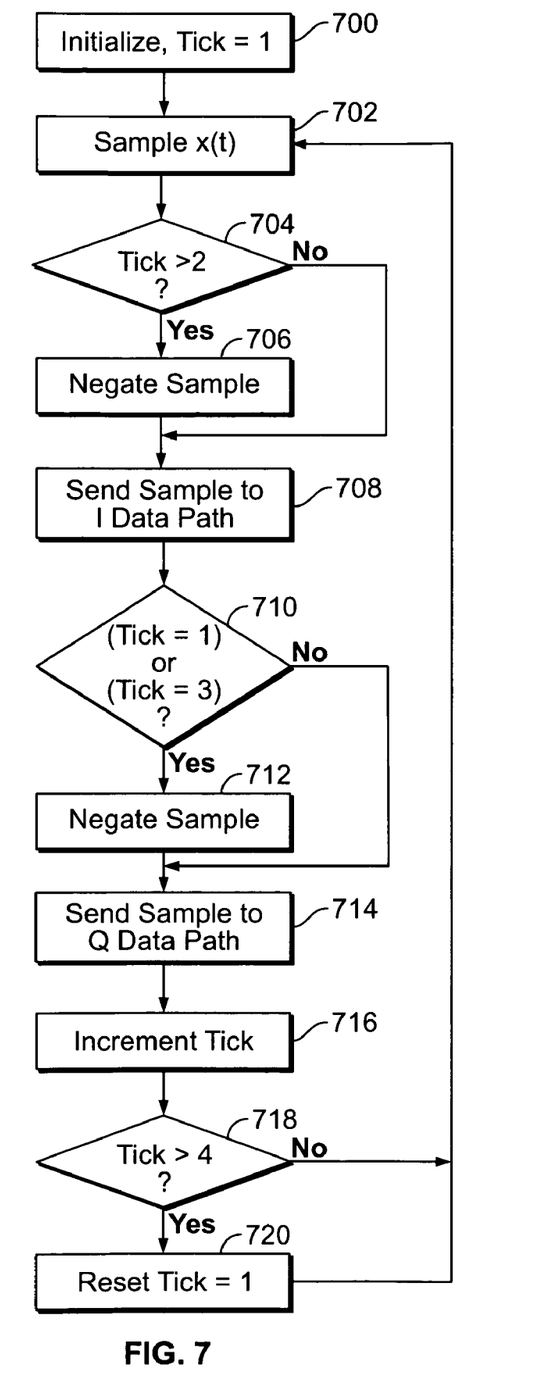
FIG. 7 is a flowchart illustrating a downconversion process according to another embodiment in which the beat coefficient n is equal to 4.

The beat frequency of the effective sampling function and the harmonic frequencies may be changed by changing the number of complex samples per sampling period, or, stated another way, by changing the beat coefficient n. In some embodiments, if n divided by two results in an odd quotient, then the overall sampling rate of the ADC is twice the sample rate of the I or Q channels. This is illustrated in FIGS. 4, 5A-5C and 6A-6C. If n divided by two results in an even quotient, then the overall sampling rate may be equal to the sample rate of the I and Q channels. FIG. 7 is a flowchart illustrating a downconversion process according to another embodiment in which the beat coefficient n is equal to 4. In this example, a function s(t) continuously generates periodic complex sampling events. Each sample is handled in one of four ways. A variable, "tick", is defined and used to track which of the four ways will be used to handle a particular sample, such that each of the four ways of handling samples is applied once every four samples, in the same order. Tick is set to 1 when the process initializes (700). A sample of x(t) is taken (702). It is then determined whether tick is greater than 2 (704). If tick is greater than 2, the sample is then negated (706) and sent to the in-phase data path (708). If, however, tick is less than or equal to 2, the sample is not negated and is sent to the in-phase data path directly. It is then determined whether tick is equal to 1 or 3 (710). The sample is negated if tick is either 1 or 3 (712), and is not negated otherwise. The sample is then sent to the quadrature data path (714). Tick is then incremented (716). It is then determined whether tick is greater than 4 (718). If tick is greater than 4, it is reset to 1 (720). Otherwise, tick is not reset. The process then repeats and a new sample is taken (702). Using the process shown in FIG. 7, both an I and Q component are generated for each sampling event, which results in a complex baseband sample being generated for each input sample.

Figure 8A:
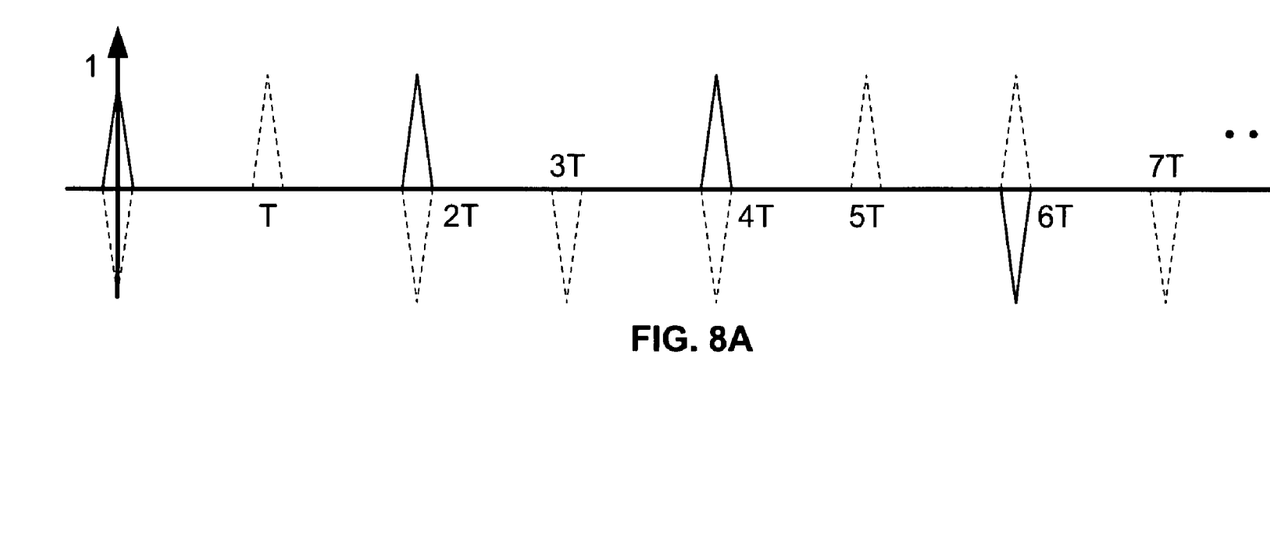
FIGS. 8A-8B are plots illustrating the sampling function according to the example process shown in FIG. 7.
Figure 8B:
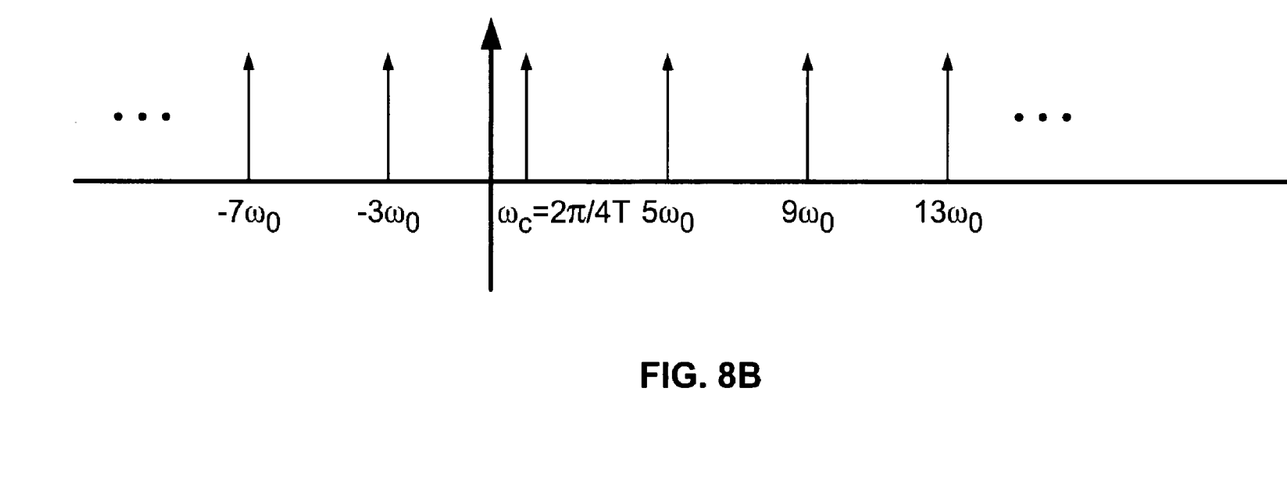

FIGS. 8A-8B are plots illustrating the sampling function according to the example process shown in FIG. 7. FIG. 8A is a time domain function diagram illustrating the effective overall sampling signal used in the example process shown in FIG. 7. The signal x(t) is sampled at one half of the overall sampling rate as in the examples shown in FIGS. 5A-5C and 6A-6C. Each sampling event provides both an in-phase sample and a quadrature sample. The pulses that provide the in-phase samples are illustrated using solid lines and the pulses that provide the quadrature samples are illustrated using dashed lines. Dot-dash lines are used to illustrate pulses that provide in-phase and quadrature samples that are either both negated or both not negated. FIG. 8B is a frequency domain plot illustrating the frequency spectrum of the effective sampling function shown in FIG. 8A. In this example, the period of the beat frequency is 4T, during which 4 complex samples are generated. The I component of the sampling wave form leads the Q component, thus the resulting frequency spectrum is similar to the frequency spectrum shown in FIG. 5B, except that the beat frequency $\omega_0$ is $2\pi/4T$.

Other downconversion processes may be used in different embodiments to obtain different beat frequencies. Various aspects of the process, including the negation sequence, the sorting sequence, etc., may be adjusted to obtain a desired effective sampling function having a desired frequency harmonic. In some embodiments, the beat frequency is changed by adjusting the number of I and Q samples included in a sampling period of the effective sampling function.

Figure 9:
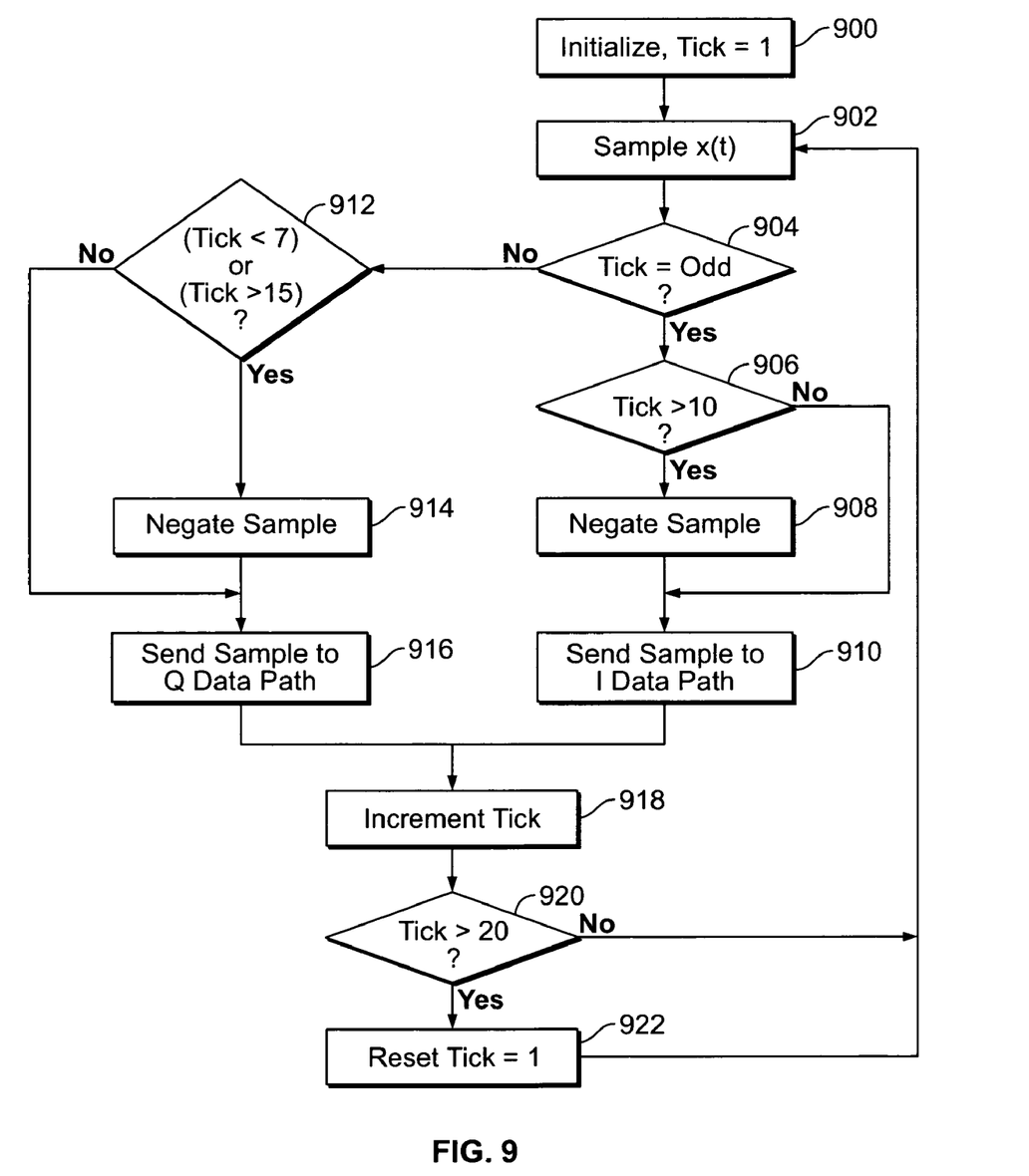
FIG. 9 is a flowchart illustrating a downconversion process according to another embodiment.

FIG. 9 is a flowchart illustrating a downconversion process according to another embodiment. In this example, the effective sampling function has a beat coefficient of 10. Because 10/2 results in an odd quotient, the overall sampling rate is twice the sampling rate for I or Q. A function s(t) continuously generates periodic complex sampling events. An algorithm is defined for handling the samples, which repeats the same sequence every 10 complex samples. A variable "tick" is defined and used to track the numbering of the sampling events. Tick is set to 1 when the process initializes (900). A sample of x(t) is taken (902).

It is then determined whether tick is odd (904). If tick is odd, it is then determined whether tick is greater than 10 (906). If tick has an odd value that is greater than 10, the sample is negated (908) and then sent to the in-phase data path (910). If, however, tick has an odd value that is less than or equal to 10, no negation is required and the sample is directly sent to the in-phase data path (910). If tick is even, it is determined whether tick is less than 7 or greater than 15 (912). If tick is less than 7 or greater than 15, the sample is negated and sent to the quadrature data path (916); otherwise, the sample is not negated and is sent to the quadrature data path directly (916).

After the sample is sent to either the I or the Q data path, tick is incremented (918). It is then determined if tick is greater than 20 (920). Tick is reset to 1 if it is greater than 20 (922). The process is then repeated and a new sample is taken (902).

Figure 10A:
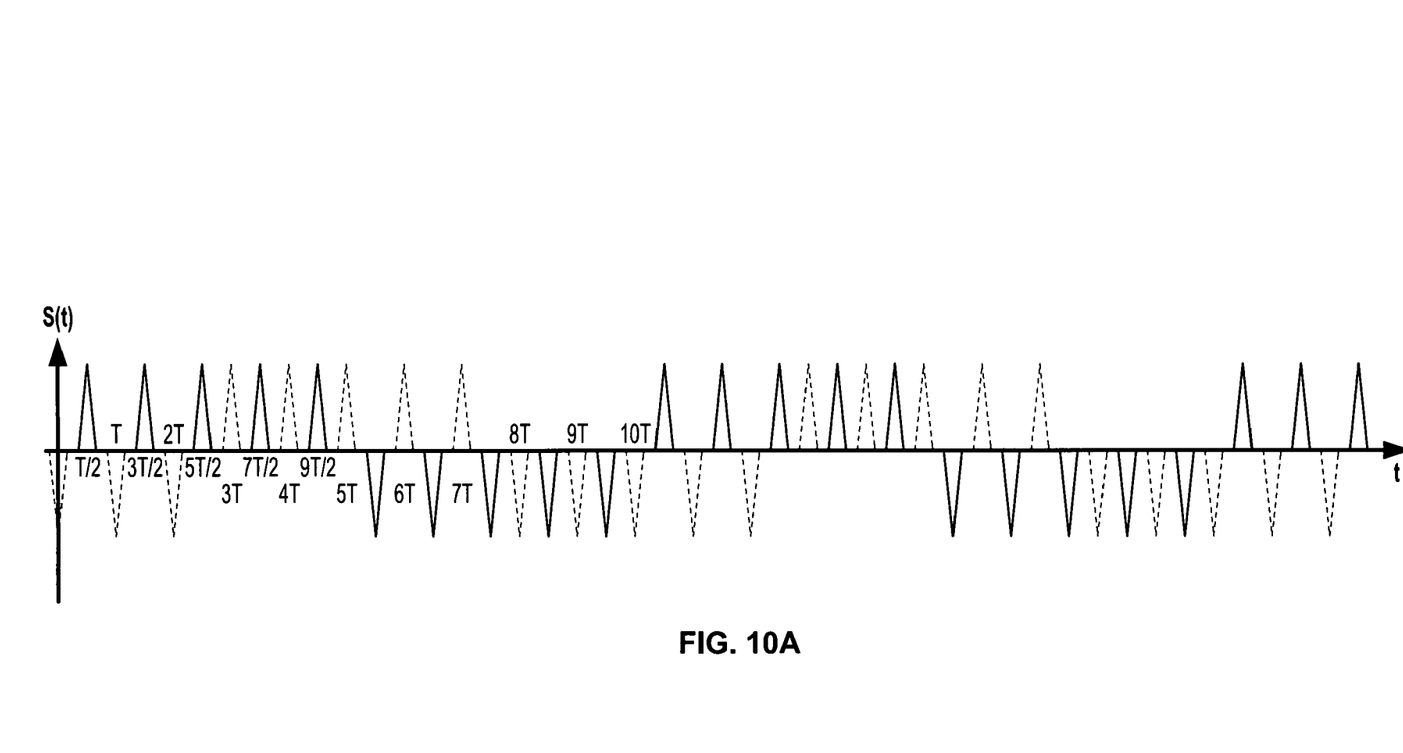
FIG. 10 is a time domain plot of the effective sampling function according to the process described in FIG. 9.

FIG. 10 is a time domain plot of the effective sampling function according to the process described in FIG. 9. In the example shown, Q component leads I component. In a complex sampling period of 10T, a total of 10 complex samples are generated. The resulting frequency spectrum of the effective sampling function is similar to what was shown in FIG. 6B, although the beat frequency $2\pi/10T$ is 5 times lower than the beat frequency of the signal shown in FIG. 6B.

Aspects of the algorithm used to generate the complex samples such as the negation sequence and/or the sorting sequence may be varied to select an effective sampling function with desired beat frequency. These sequences may be selected via a process that is automated or partially automated. In some embodiments, an initial process is chosen. If the downconverted output does not meet the desired baseband signal frequency range, an iterative technique may be applied to adjust the sequences until an acceptable output is obtained. Parameters taken into consideration when adjusting the algorithm include the modulated signal bandwidth, the range of available sampling frequencies, as well as characteristics of the system such as sampling frequency phase noise, filter rolloff, etc.

For example, assume a radio receiver front end used to receive a complex signal modulated on a carrier wave provides a received signal at an intermediate frequency (IF) of 10.7 MHz. Using the techniques described herein, one way to downconvert the received signal would be to define a negation and sorting algorithm that yields an effective sampling function having a beat frequency that has a harmonic equal to 10.7 MHz. If the beat frequency of the effective sampling function has such a harmonic, applying the effective sampling function to the received signal as described herein would result in a single image of the downconverted signal to appear at 0 Hz (i.e., DC), as can be seen from FIG. 5C. However, given a particular overall sampling rate or sampling rate range, several sampling waveforms may be examined in order to find a sampling function having both the desired harmonic and a beat frequency high enough to substantially eliminate aliasing. For example, assuming an ADC sampling frequency of 4.333 MHz, using the algorithm illustrated in FIGS. 4 and 5A-5C, the complex sampling rate $$T \text{ is } \frac{2}{4.333 \times 10^6} \text{ seconds.}$$

The beat coefficient is 2, thus the resulting beat frequency of ½T is 1.083 MHz. The effective sampling function has nearby harmonic frequencies at 9.75 MHz and −11.917 MHz, which may be outside the range within which the IF can be adjusted or outside the bandwidth of the IF filter. Alternatively, using the same 4.333 Mhz ADC sampling frequency, the algorithm illustrated in FIGS. 9 and 10 results in a complex sampling rate $$T \text{ of } \frac{2}{4.333 \times 10^6} \text{ seconds,}$$

and a beat frequency $\frac{1}{10}T$ at 216.7 KHz. The beat frequency of 216.7 KHz has a $49^{th}$ harmonic at 10.62 MHz, which is 83.333 Khz lower than the desired 10.7 Mhz IF. However, if the IF filter can be adjusted or widened slightly in bandwidth and if the RF local oscillator (LO) can be adjusted in increments of 83.333 Khz, and if the bandwidth of the modulated signal is less than 433.4 Khz, the algorithm illustrated in FIGS. 9 and 10 may be used for sampling. Other negation and sorting algorithms could be defined to achieve an effective sampling function having a beat frequency with a harmonic at any desired frequency and/or within any desired frequency range, which enables one to apply the techniques described herein to downconvert a signal at any frequency.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A signal processing system, comprising:
    an inverter configured to selectively negate a plurality of samples of a signal to provide negated and non-negated samples of the signal; and
    a first low pass filter configured to use a first set of selected ones of the negated and non-negated samples as in-phase (I) of a plurality of complex samples and a second low pass filter configured to use a second set of selected ones of the negated and non-negated samples as quadrature (Q) components of the plurality of complex samples;
    wherein the plurality of complex samples correspond to the output of an effective sampling function;
    and further comprising a processor configured to select a beat frequency of the effective sampling function by adjusting the algorithm, including by iteratively adjusting one or both of: a negation sequence in accordance with which samples comprising the plurality of samples of the signal are negated and a sorting sequence in accordance with which samples are sorted into I and Q components, until a beat frequency resulting in an output having a desired characteristic is achieved.

2. A signal processing system as recited in claim 1, wherein the effective sampling function is a complex sampling function.

3. A signal processing system as recited in claim 1, wherein the plurality of samples comprises a plurality of digital samples at a non-zero carrier frequency.

4. A signal processing system as recited in claim 1, wherein the plurality of complex samples comprises a plurality of complex samples of the signal at baseband.

5. A signal processing system as recited in claim 1, wherein the signal is a modulated signal.

6. A signal processing system as recited in claim 1, wherein the signal is a modulated signal and the plurality of complex samples comprise a directly downconverted complex image of the modulated signal.

7. A signal processing system as recited in claim 1, wherein each of the plurality of samples results in either an I component of one of the plurality of complex samples or a Q component of one of the plurality of complex samples.

8. A signal processing system as recited in claim 1, wherein each of the plurality of samples results in both an I component of one of the plurality of complex samples and a Q component of one of the plurality of complex samples.

9. A signal processing system as recited in claim 1 wherein selecting the beat frequency of the effective sampling function comprises reversing the order of sorting to select a positive image or a negative image.

10. A signal processing system as recited in claim 1 wherein adjusting the algorithm comprises modifying a beat coefficient.

11. A signal processing system as recited in claim 10, wherein adjusting the algorithm comprises modifying a beat coefficient "n" comprising an integer by which the rate of complex sampling events "T" is multiplied to yield the period of the beat frequency of the effective sampling function.

12. A signal processing system as recited in claim 10, wherein the plurality of complex samples includes a baseband signal having a bandwidth, and the effective sampling function includes a beat frequency greater than one half of the bandwidth.

13. A signal processing system as recited in claim 1, further comprising an analog to digital converter configured to generate the plurality of samples of the signal.

14. A signal processing system as recited in claim 1, wherein one or more of the inverter, the first low pass filter, and the second low pass filter comprise a field programmable gate array (FPGA).

15. A signal processing system as recited in claim 1, wherein one or more of the inverter, the first low pass filter, and the second low pass filter, and the processor comprises an integrated circuit.

* * * * *